(12) United States Patent
Fujino et al.

(10) Patent No.: US 7,545,133 B2
(45) Date of Patent: Jun. 9, 2009

(54) POWER SUPPLY APPARATUS

(75) Inventors: Masato Fujino, Muko (JP); Soichi Watanabe, Nagaokakyo (JP)

(73) Assignee: Murata Manufacturing Co., Ltd. (JP)

( * ) Notice: Subject to any disclaimer, the term of this patent is extended or adjusted under 35 U.S.C. 154(b) by 296 days.

(21) Appl. No.: 11/557,221

(22) Filed: Nov. 7, 2006

(65) Prior Publication Data

US 2007/0063285 A1    Mar. 22, 2007

Related U.S. Application Data

(63) Continuation of application No. PCT/JP2005/020813, filed on Nov. 14, 2005.

(30) Foreign Application Priority Data

Feb. 15, 2005   (JP) ............... 2005-038231

(51) Int. Cl.
*H02M 3/158* (2006.01)
(52) U.S. Cl. ............... 323/285; 323/271; 323/351; 323/290
(58) Field of Classification Search ............... 323/350, 323/351, 271, 282, 284, 285, 288, 290
See application file for complete search history.

(56) References Cited

U.S. PATENT DOCUMENTS

| | | | | |
|---|---|---|---|---|
| 3,617,860 A | * | 11/1971 | Williams et al. | 323/351 |
| 5,691,632 A | * | 11/1997 | Otake | 323/282 |
| 5,793,190 A | * | 8/1998 | Sahlstrom et al. | 323/222 |
| 6,710,582 B2 | * | 3/2004 | Watanabe | 323/222 |
| 7,307,407 B2 | * | 12/2007 | Nishi et al. | 323/350 |

OTHER PUBLICATIONS

Written Opinion.
International Search Report issued Jan. 24, 2006.
Office Action issued Mar. 28, 2008 in corresponding Chinese Application No. 200580015566.0 with English Language Translation.

* cited by examiner

*Primary Examiner*—Jessica Han
*Assistant Examiner*—Emily Pham
(74) *Attorney, Agent, or Firm*—Ostrolenk, Faber, Gerb & Soffen, LLP

(57) ABSTRACT

In a power supply apparatus in which a source of a MOSFET is connected to a node of a rectifier diode and a choke coil through a resonance coil, a series circuit including a capacitor and a MOSFET is connected to a series circuit including the resonance coil and the rectifier diode, and the MOSFET and the MOSFET are driven by PWM control so that the MOSFET and the MOSFET are alternately turned on with a period in which both MOSFETs are turned off, a resistor is connected in parallel with the capacitor, and optionally another diode is connected in series with the resistor.

14 Claims, 2 Drawing Sheets

PRIOR ART

POWER SUPPLY APPARATUS

CROSS-REFERENCE TO RELATED APPLICATIONS

This is a continuation of PCT/JP2005/020813 filed Nov. 14, 2005, which claims priority of JP2005-038231 filed Feb. 15, 2005, incorporated by reference.

BACKGROUND OF THE INVENTION

1. Technical Field

The present invention relates to power supply apparatuses, and more particularly, to a power supply apparatus for a DC-operating high-voltage discharge lamp.

2. Background Art

High-voltage discharge lamps that are turned on by application of DC voltage and used as lamps for projectors, for example, are available. Although the air pressure inside a high-voltage discharge lamp is relatively low when the lamp is not turned on (at a normal temperature), the air pressure rises in accordance with rising temperature after discharge starts. Since discharge is more likely to occur when the air pressure inside a discharge lamp is lower, discharge is likely to occur and the resistance of the discharge lamp, as a load, is low when discharge starts. In contrast, a discharge is relatively less likely to occur and the resistance of the discharge lamp, as a load, becomes higher after the temperature rises due to turning on of the discharge lamp. However, since resistance values of loads are not always constant, a power supply apparatus that controls the load power to be constant is preferably used for a high-voltage discharge lamp.

A power supply apparatus disclosed in Japanese Unexamined Patent Application Publication No. 2003-189602 (Patent Document 1) is available. The power supply apparatus described in Patent Document 1 is used to implement zero-voltage switching (ZVS) of switch elements in a step-down or step-up type chopper circuit, and the power supply apparatus includes a resonance coil, a capacitor serving as a constant voltage source, and a second switch element in addition to basic components constituting the chopper circuit, such as a first switch element, a choke coil, and a rectifier diode. However, the power supply apparatus disclosed in Patent Document 1 is not specifically intended to be used for turning on a discharge lamp.

FIG. 3 is a circuit diagram of a power supply apparatus according to a first embodiment of Patent Document 1. In FIG. 3, a power supply apparatus 10 is based on a step-down chopper circuit, and includes a direct-current power supply Vin, a rectifier diode D1, a choke coil L1, a MOSFET Q1 serving as a first switch element, and a smoothing capacitor C1 as basic elements of the chopper circuit. The power supply apparatus 10 also includes a diode D2 serving as a first diode, and capacitors C2 and C4. The diode D2 is a body diode for the MOSFET Q1, and the capacitor C2 defines a junction capacitance, that is, the parallel capacitance between the drain and source of the MOSFET Q1. The capacitor C4 defines junction capacitance, that is, the parallel capacitance between the anode and cathode of the rectifier diode D1.

The power supply apparatus 10 further includes a MOSFET Q2 serving as a second switch element, a diode D3 serving as a second diode, a capacitor C3, a resonance coil L2, a capacitor C5 serving as a first capacitor that is a constant voltage source, a diode D4 serving as a third diode, a resistor R1 for current detection, and a control circuit 11. The diode D3 is a body diode of the MOSFET Q2 and the capacitor C3 defines a junction capacitance, that is, the parallel capacitance between the drain and source of the MOSFET Q2.

The drain serving as a first end of the MOSFET Q1 is connected to a first end of the direct-current power supply Vin and the source of the MOSFET Q1 serving as a second end of the MOSFET Q1 is connected to a first end of the choke coil L1 through the resonance coil L2. A second end of the direct-current power supply Vin is grounded. A second end of the choke coil L1 is connected to a first output terminal Po. The cathode of the rectifier diode D1 serving as a first end of the rectifier diode D1 is connected to the first end of the choke coil L1, and the anode of the rectifier diode D1 serving as a second end of the rectifier diode D1 is connected to the second end of the direct-current power supply Vin. The smoothing capacitor C1 is connected between the first output terminal Po and a second output terminal Po. A first end of a series circuit including the capacitor C5 and the MOSFET Q2 is connected to a node connecting the MOSFET Q1 and the resonance coil L2, and a second end of the series circuit is connected to the second end of the direct-current power supply Vin. A resistor R1 is connected between the first end of the smoothing capacitor C1, that is, the second output terminal Po, and the second end of the direct-current power supply Vin. The diode D4 is connected in parallel to a series circuit including the MOSFET Q1 and the resonance coil L2. The control circuit 11 is connected to the first and second output terminals Po, both ends of the resistor R1, a gate serving as a control terminal of the MOSFET Q1, and a gate serving as a control terminal of the MOSFET Q2. The order in which the capacitor C5 and the MOSFET Q2 are connected may be reversed so long as they are connected in series.

In the power supply apparatus 10 having the above configuration, the control circuit 11 detects an output voltage Vout. Since output current flows through the resistor R1, the control circuit 11 detects the output current from a voltage across the resistor R1. The MOSFETs Q1 and Q2 are alternately turned on and off with a dead time therebetween in which both MOSFETs are turned off so that the output voltage or the output power becomes constant. The frequency of MOSFET switching follows the frequency of an oscillation circuit contained in the control circuit 11, and stabilization of the output voltage or the output power is performed by changing the ON-OFF duty cycle of each switch element, that is, by PWM control.

The control circuit 11 has an overcurrent protection circuit for temporarily blocking the oscillation to stop the switching (preventing the MOSFET Q1 from being turned on) to solve the problem when the output current becomes an overcurrent.

A case in which the power supply apparatus 10 is used to turn on a high-voltage discharge lamp will be considered. It is assumed that the choke coil L1 has an inductance of 1 mH, the resonance coil L2 has an inductance of 30 µH, the smoothing capacitor C1 has a capacitance of 0.47 µF, and the capacitor C5 has a capacitance of 0.47 µF. It is also assumed that the capacitors C2, C3, and C4 have capacitances in the range of dozens to hundreds of pF. An input voltage Vin is assumed to be 370 V, and a predetermined output voltage Vout on startup of the power supply apparatus 10 is assumed to be 280 V. The switching frequency of the switch elements according to the oscillation circuit included in the control circuit 11 is assumed to be 100 kHz.

In the power supply apparatus 10, the control circuit 11 operates so that the output voltage becomes constant on startup of the power supply apparatus. When the high-voltage discharge lamp is to be turned on, 17 kV is added to an output voltage of 280 V by an igniter provided between the power supply apparatus and the high-voltage discharge lamp, and discharge is started by applying the combined voltage to the high-voltage discharge lamp. The power supply apparatus operates in a light-load state since no current flows through the high-voltage discharge lamp for a few hundred milliseconds before discharge starts.

Once discharge of the high-voltage discharge lamp is started, the output of the power supply apparatus 10 is directly applied to the high-voltage discharge lamp. Since the resistance of the high-voltage discharge lamp as a load is low when the temperature is low immediately after the discharge is started, a large current attempts to flow. In actuality, however, the overcurrent protection circuit is activated and the current is limited to, for example, about 4 A. At this time, the voltage across the high-voltage discharge lamp is about 10 V.

Thereafter, the temperature of the high-voltage discharge lamp rises within several tens of seconds, the resistance of the discharge lamp as a load becomes high, and the discharge state becomes stable. However, even if the discharge becomes stable, the load resistance value of the high-voltage discharge lamp is not always stable. Therefore, as the load resistance value changes, the power supply apparatus 10 performs constant power control so that the load power becomes constant, for example, at 200 W. Specifically, the output voltage of the power supply apparatus 10 changes, for example, within the range of approximately several tens of volts to a hundred and several tens of volts.

As described above, in the case where the power supply apparatus 10 is used for turning on the high-voltage discharge lamp, the power supply apparatus 10 operates with a light load since negligible load current flows when the power supply apparatus 10 starts up. In the power supply apparatus disclosed in Patent Document 1, there seems to be no apparent problem since an operation of the circuit is described assuming that there is a normal load. However when the load is light at the starting of discharge of the high-voltage discharge lamp, there is a problem, since the operation of the circuit is different from a normal operation.

First, the capacitor C5 is charged by the power supply voltage Vin so that the MOSFET Q2 side becomes negative when the load is light. The charging voltage Vx of the capacitor C5 at this time may reach the output voltage (Vx=−280 V) at maximum. In contrast, when the normal load value is applied, the capacitor C5 is charged at a substantially constant voltage Vx so that the MOSFET Q2 side is positive. In this case, Vx is in the range of 10 V to 20 V. Charging the capacitor C5 at a predetermined voltage Vx makes the voltage Va at the node of the MOSFET Q1 and the resonance coil L2 to be −Vx when the MOSFET Q2 is ON, and the direction of the current ib flowing through the resonance coil L2 is reversed. As a result, the diode D2 becomes conductive and the zero-voltage switching of the MOSFET Q1 can be achieved.

At this time, as described above, the capacitor C5 is temporarily charged at a voltage close to the output voltage on startup when the high-voltage discharge lamp is turned on. This leads to a problem in that a component having a high withstand voltage must be used, although it is not required during the normal operation.

In the power supply apparatus 10, since the load is light and the output current Iout becomes small when turning on (and before turning on) the high-voltage discharge lamp, the current ib flowing through the resonance coil L2 becomes small. Therefore, an electric charge that is charged on the capacitor C5 in the reversed direction of the normal operation is not discharged, and that state is maintained. In this case, since the voltage Va does not become negative, the direction of the current ib that flows through the resonance coil L2 does not become reversed. Thus, the zero-voltage switching of the MOSFET Q1 cannot be achieved.

Furthermore, since the impedance when turning on the high-voltage discharge lamp is high, as described above, negligible load current flows. In this case, the control circuit 11 makes the ON period of the MOSFET Q1 short in order to prevent the output voltage from becoming greater than or equal to a predetermined value. However, the ON period cannot be shortened without limitation. When the switch element is turned on, the switch element cannot be immediately turned off. Thus, the minimum ON period is determined. This causes excessive power supply and increases the output power voltage. To prevent the excessive power supply and increased output power voltage, the control circuit 11 enters a blocking oscillation mode in which turning on of the MOSFET Q1 is stopped once or several times to suppress the rising of the output voltage.

However, since the frequency and cycle of the switching are fixed, even if the load suddenly changes from light to heavy when the MOSFET Q1 is turned off in the blocking oscillation mode, the MOSFET Q1 cannot be immediately turned on in accordance with the change of the load. As a result, there is a problem in that the output voltage is reduced. This means a long time is required for shifting to a stable turn-on state since the load resistance suddenly becomes small when the power supply apparatus for the high-voltage discharge lamp starts discharging as described above, and the operation cannot follow the change of the load.

Moreover, the state in which the capacitor C5 is charged in the reversed direction of the normal operation is maintained when the load is light on startup, as described above. The charging voltage of the capacitor C5 in this case is, for example, 280 V in the direction in which the MOSFET Q2 side becomes negative. When the load immediately after the high-voltage discharge lamp is turned on has low resistance, the electric charge charged on the capacitor C1 at 280 V is discharged toward the load, and the electric charge charged on the capacitor C5 at 280 V in the reversed direction of the normal operation is also discharged toward the load. This is referred to as a secondary inrush current.

In this case, the discharge current of the capacitor C5 flows through the resistor R1 and the overcurrent protection circuit operates. When the overcurrent protection circuit operates, however, the switching of the power supply apparatus 10 becomes intermittent and this operation is the same as the operation with a light load, and there is a disadvantage in that the operation cannot follow the change of the load thereafter.

SUMMARY OF THE INVENTION

The present invention addresses the disadvantages described above and provides a power supply apparatus that can perform zero-voltage switching even when the load is light, that does not enter a blocking oscillation mode, and that does not generate a secondary inrush current.

According to a first aspect of the invention, a power supply apparatus including a rectifier diode (D1) and a choke coil (L1) whose first ends are connected to each other, a first switch element (Q1) whose first end is connected to a node of the rectifier diode (D1) and the choke coil (L1) through a resonance coil (L2), a first diode (D2) connected in parallel to the first switch element (Q1), a series circuit including a first capacitor (C5) and a second switch element (Q2), the series circuit being connected in parallel to a series circuit including the resonance coil (L2) and the rectifier diode (D1), and a second diode (D3) connected in parallel to the second switch element (Q2), wherein each of the first switch element (Q1), the second switch element (Q2), and the rectifier diode (D1) has a parallel capacitance (C2, C3 and C4, respectively) between terminals thereof, further comprises a first resistor (R2) connected in parallel to the first capacitor (C5).

According to a second aspect of the invention, the power supply apparatus may further include a diode (D4) connected in parallel to a series circuit including the first switch element (Q1) and the resonance coil (L2).

According to a third aspect of the present invention, the power supply apparatus may further include a diode (D5) provided in series with the first resistor (R2).

In the power supply apparatus according to these aspects of the present invention, a second end of the first switch element (Q1) is connected to a first end of a direct-current power supply (Vin), a second end of the choke coil (L1) is connected to an output terminal, a second end of the rectifier diode (D1) is connected to a second end of the direct-current power supply (Vin), and thereby a step-down power supply is provided.

In a power supply apparatus according to these aspects of the present invention, when the power supply apparatus is used for turning on a high-voltage lamp, zero-voltage switching can be performed even when a load is light, the operation does not enter a blocking oscillation mode, and a secondary inrush current is not generated.

Other features and advantages of the present invention will become apparent from the following description of embodiments of the invention which refers to the accompanying drawings.

DETAILED DESCRIPTION OF EMBODIMENTS OF THE INVENTION

First Embodiment

Figure 1:
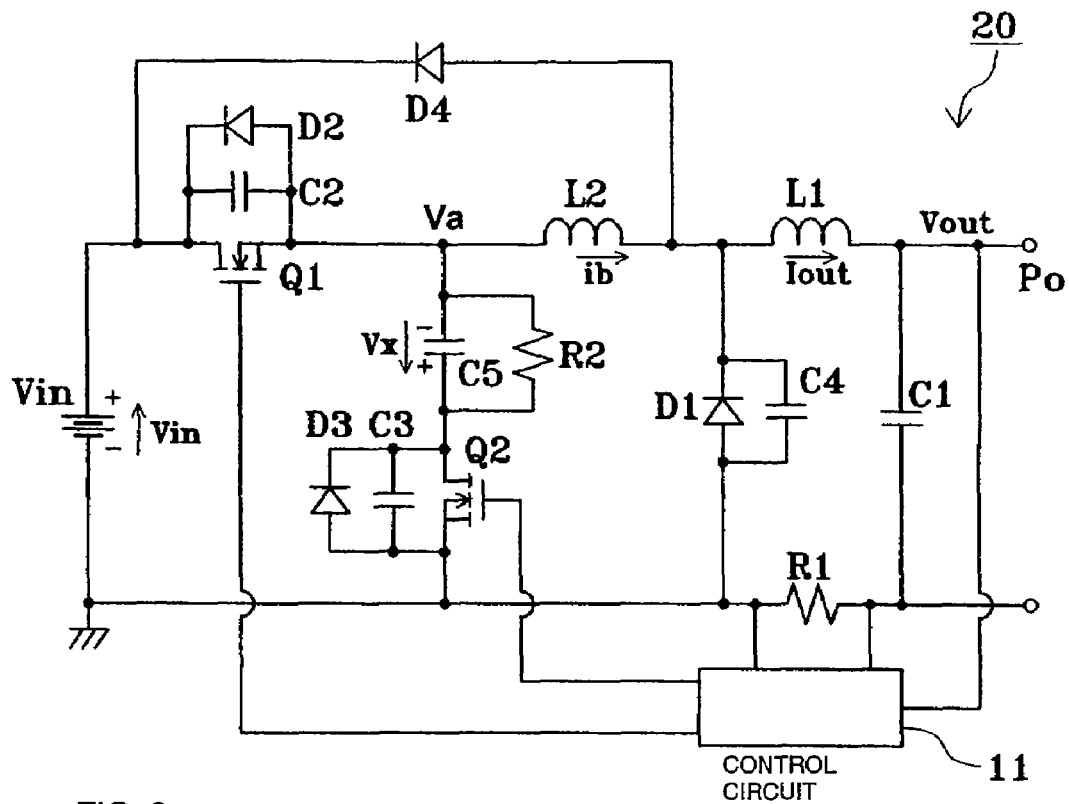
FIG. 1 is a circuit diagram of a power supply apparatus according to a first embodiment of the present invention.

FIG. 1 is a circuit diagram of a power supply apparatus according to a first embodiment of the present invention. In FIG. 1, the same reference numerals are used to denote elements the same as or similar to elements in FIG. 3, and descriptions thereof are omitted.

Figure 3:
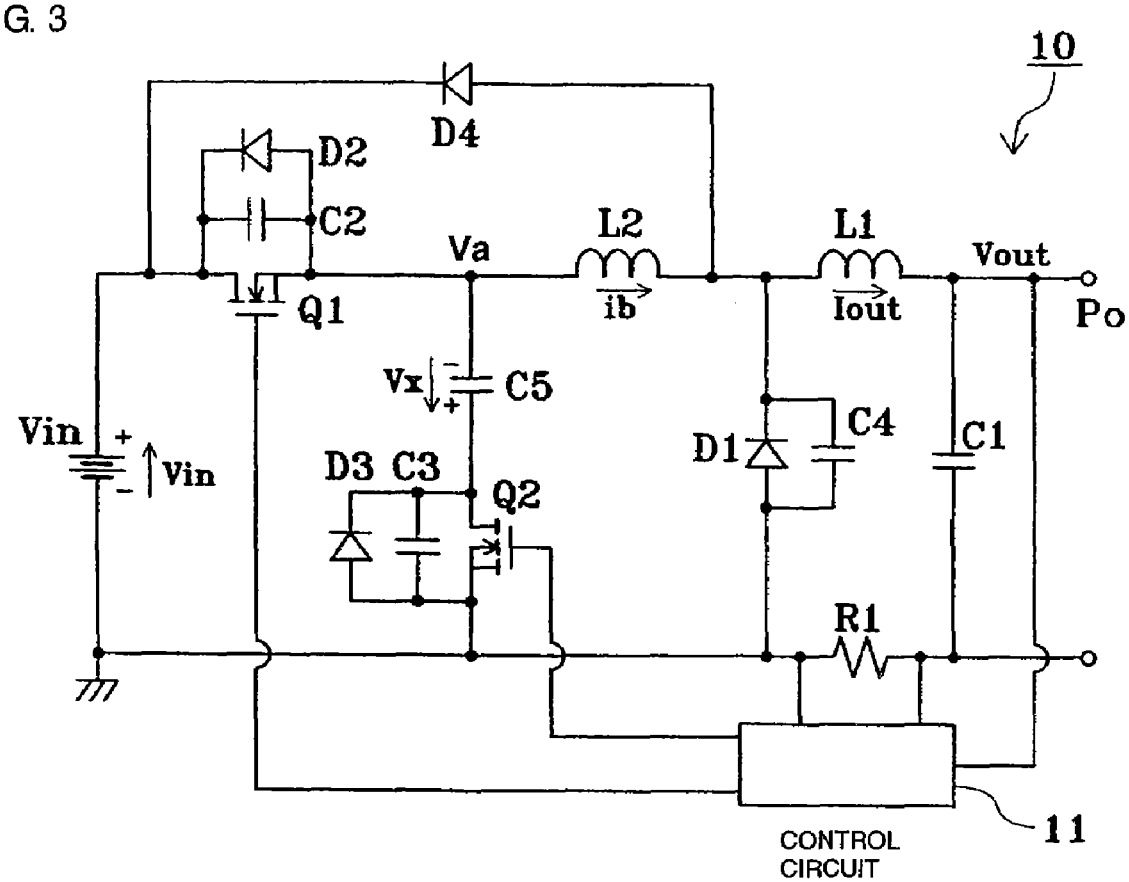
FIG. 3 is a circuit diagram of a known power supply apparatus.

In a power supply apparatus 20 shown in FIG. 1, a resistor R2 serving as a first resistor is connected in parallel to a capacitor C5 serving as a first capacitor that is also provided in a power supply apparatus 10 in FIG. 3. The rest of the configuration is the same as that of the power supply apparatus 10. The resistance of the resistor R2 is set to 2.4 kΩ in this embodiment.

In the power supply apparatus 20 having the configuration mentioned above, even if charging of the capacitor C5 is attempted in the reversed direction of the normal operation when the load is light, the capacitor C5 is negligibly charged in the reversed direction since an electric charge is discharged through the resistor R2. Therefore, generation of a secondary inrush current is prevented. Furthermore, an overcurrent protection circuit does not operate because no secondary inrush current is generated, and thus, the operation does not enter an intermittent switching mode. Therefore, the problem that the operation does not follow the change of the load thereafter does not occur.

Moreover, since the capacitor C5 is not charged in the reversed direction, a charging voltage of the capacitor C5 is always maintained at a low value, and it becomes unnecessary to use a component having a high withstand voltage.

Further, since the capacitor C5 is negligibly charged in the reversed direction due to discharge caused by the presence of the resistor R2, the capacitor C5 is charged at a substantially constant voltage Vx so that a MOSFET Q2 side is positive even when a load is light, and zero-voltage switching can be achieved even when the load is light.

Furthermore, since a current flows from a drain side to a source side of a MOSFET Q1 and a regenerative operation from an output side to an input side is performed when zero-voltage switching is performed, output voltage is not increased by an excessive power supply when the load is light. Thus, the operation does not enter a blocking oscillation mode, and a problem in that the operation cannot follow the load change from light to heavy does not occur.

If the resistance of the resistor R2 is excessively large, charging of the capacitor C5 in the reversed direction cannot be prevented, and if the resistance is excessively small, the amount of loss caused by a current flowing through the resistor R2 in the normal operation becomes large. Preferably, under the above condition, for example, the upper limit of the resistance of the resistor R2 is 10 kΩ, and the lower limit of the resistance is 1 kΩ.

Second Embodiment

Figure 2:
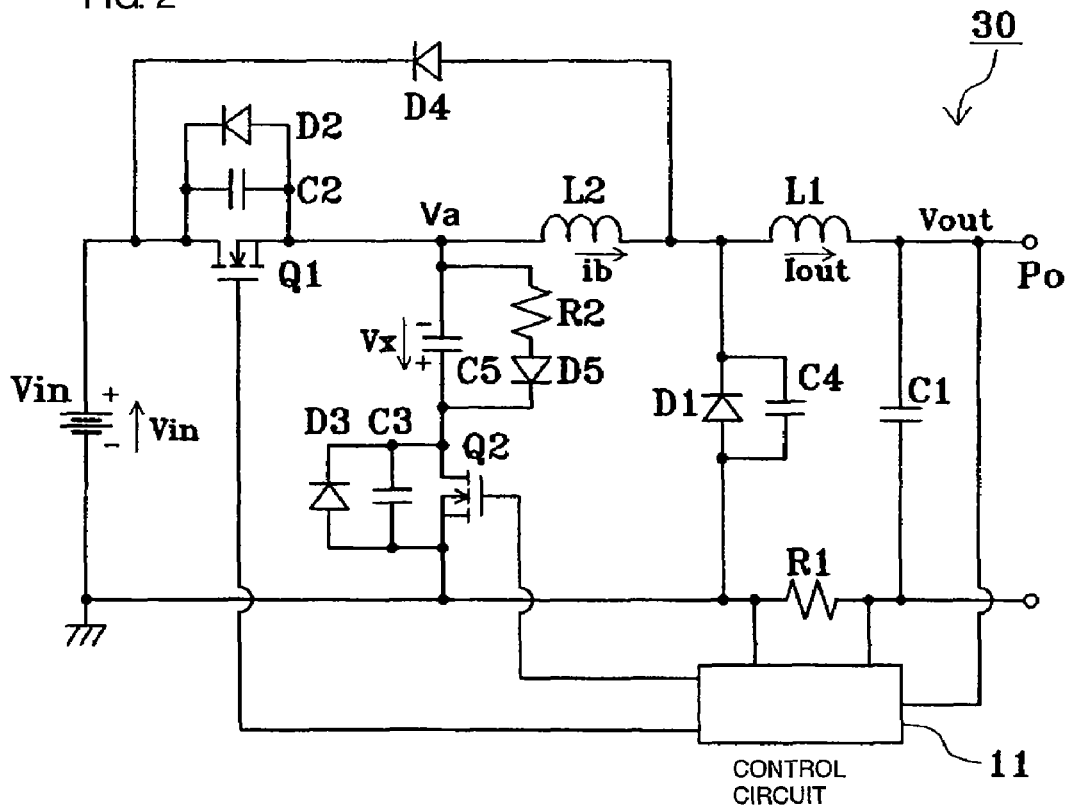
FIG. 2 is a circuit diagram of a power supply apparatus according to a second embodiment of the present invention.

FIG. 2 is a circuit diagram of a power supply apparatus according to a second embodiment of the present invention. In FIG. 2, the same reference numerals are used to denote elements the same as or similar to elements in FIG. 1, and descriptions thereof are omitted.

In a power supply apparatus 30 shown in FIG. 2, a diode D5 serving as a fourth third diode is provided in series with the resistor R2 serving as the first resistor that is also provided in the power supply apparatus 20 in FIG. 1. That is, a series circuit including the resistor R2 and the diode D5 is connected in parallel to the capacitor C5. The diode D5 is positioned so that the cathode thereof is connected to a MOSFET Q2. The rest of the configuration is the same as that of the power supply apparatus 20.

In the power supply apparatus 30 having the configuration mentioned above, even if charging of the capacitor C5 is attempted in the reversed direction at the startup, the capacitor C5 is negligibly charged in the reversed direction since an electric charge is discharged through the resistor R2 and the diode D5. Therefore, generation of a secondary inrush current is prevented, as is the case with the power supply apparatus 20. Furthermore, even when a load is light, the operation does not enter the intermittent switching mode, and a problem in that the operation cannot follow the changes of the load thereafter does not occur. Moreover, a charging voltage of the capacitor C5 is always maintained at a low value, and it becomes unnecessary to use a component having a high withstand voltage.

Furthermore, since the diode D5 is provided, an electric charge of the capacitor C5 charged at a substantially constant voltage Vx so that a MOSFET Q2 side is positive is not discharged through the resistor R2 in the normal operation, and thus, no loss caused by the current flowing through the resistor R2 in the normal operation occurs.

When the diode D5 is provided, no problem is apparent even if the resistance of the resistor R2 is small. However, if the resistance of the resistor R2 is small, energy that is normally regenerated by charging capacitor C5 is also discharged resulting in loss of the discharged energy. It is possible that the loss of the energy is larger than a loss reduced by zero-voltage switching. Therefore, preferably, the resistance of the resistor R2 should be set within the range described in the first embodiment.

In the power supply apparatuses 20 and 30 according to the above-mentioned embodiments, a diode D4 serving as a fourth diode is provided in parallel with the series circuit including the MOSFET Q1 and a resonance coil L2. The diode D4 is provided to prevent unnecessary noise from being generated by the occurrence of voltage resonance between the resonance coil L2 and the capacitor C4 when the current flowing through a rectifier diode D1 becomes zero. Therefore, if the withstand voltage of the rectifier diode D1 is sufficient to withstand the voltage resonance, and if there is no possibility of problems occurring due to unnecessary noise, the diode D4 may be omitted.

Although the present invention has been described in relation to particular embodiments thereof, many other variations and modifications and other uses will become apparent to those skilled in the art. Therefore, the present invention is not limited by the specific disclosure herein.

What is claimed is:

1. A power supply apparatus including a rectifier diode and a choke coil whose first ends are connected to each other, a first switch element whose first end is connected to a node of the rectifier diode and the choke coil through a resonance coil, a first diode connected in parallel to the first switch element, a series circuit including a first capacitor and a second switch element, the series circuit being connected in parallel to a series circuit including the resonance coil and the rectifier diode, and a second diode connected in parallel to the second switch element, wherein each of the first switch element, the second switch element, and the rectifier diode has a parallel capacitance, between terminals thereof, the power supply apparatus further comprising:
   a first resistor connected in parallel to the first capacitor; and
   a third diode connected in series with the first resistor:
   wherein said third diode is connected with the cathode thereof connected to the second switch element,
   such that when a positive voltage is present at the end of the first capacitor connected to the second switch element, said positive voltage discharges through the second switch element and does not discharge through said first resistor, and
   when a positive voltage is present at the opposite end of the first capacitor. said positive voltage discharges through the first resistor and the third diode.

2. The power supply apparatus according to claim 1, further comprising a fourth diode connected in parallel to a series circuit including the first switch element and the resonance coil.

3. The power supply apparatus according to claim 1, further comprising a fourth diode provided in series with the first resistor.

4. The power supply apparatus according to claim 2, further comprising a fourth diode provided in series with the first resistor.

5. The power supply apparatus according to claim 1, wherein a second end of the first switch element is connected to a first end of a direct-current power supply, a second end of the choke coil is connected to an output terminal, a second end of the rectifier diode is connected to a second end of the direct-current power supply, thereby providing a step-down power supply 6. The power supply apparatus according to claim 2, wherein a second end of the first switch element is connected to a first end of a direct-current power supply, a second end of the choke coil is connected to an output terminal, a second end of the rectifier diode is connected to a second end of the direct-current power supply, thereby providing a step-down power supply.

7. The power supply apparatus according to claim 3, wherein a second end of the first switch element is connected to a first end of a direct-current power supply, a second end of the choke coil is connected to an output terminal, a second end of the rectifier diode is connected to a second end of the direct-current power supply, thereby providing a step-down power supply.

8. The power supply apparatus according to claim 1, wherein a resistance value of the first resistor is between $1k\Omega$ and $10k\Omega$.

9. The power supply apparatus according to claim 2, wherein a resistance value of the first resistor is between $1k\Omega$ and $10k\Omega$.

10. The power supply apparatus according to claim 3, wherein a resistance value of the first resistor is between $1k\Omega$ and $10k\Omega$.

11. The power supply apparatus according to claim 4, wherein a resistance value of the first resistor is between $1k\Omega$ and $10k\Omega$.

12. The power supply apparatus according to claim 5, wherein a resistance value of the first resistor is between $1k\Omega$ and $10k\Omega$.

13. The power supply apparatus according to claim 6, wherein a resistance value of the first resistor is between $1k\Omega$ and $10k\Omega$.

14. The power supply apparatus according to claim 7, wherein a resistance value of the first resistor is between $1k\Omega$ and $10k\Omega$.

* * * * *